(12) United States Patent
Gradinger et al.

(10) Patent No.: US 11,101,116 B2
(45) Date of Patent: Aug. 24, 2021

(54) TARGET AND PROCESS FOR PRODUCING A TARGET

(71) Applicants: PLANSEE SE, Reutte (AT); PLANSEE COMPOSITE MATERIALS GMBH, Lechbruck am See (DE)

(72) Inventors: Rudolf Gradinger, Schwechat (AT); Martin Kathrein, Reutte (AT); Szilard Kolozsvari, Landsberg am Lech (DE); Peter Polcik, Reutte (AT)

(73) Assignees: Plansee SE, Reutte (AT); Plansee Composite Materials GmbH, Lechbruck am See (DE)

( * ) Notice: Subject to any disclaimer, the term of this patent is extended or adjusted under 35 U.S.C. 154(b) by 0 days.

(21) Appl. No.: 15/324,810

(22) PCT Filed: Jun. 30, 2015

(86) PCT No.: PCT/AT2015/000091
§ 371 (c)(1),
(2) Date: Jan. 9, 2017

(87) PCT Pub. No.: WO2016/004447
PCT Pub. Date: Jan. 14, 2016

(65) Prior Publication Data
US 2017/0200593 A1 Jul. 13, 2017

(30) Foreign Application Priority Data
Jul. 8, 2014 (AT) .............. GM 276/2014

(51) Int. Cl.
*H01J 37/34* (2006.01)
*C23C 14/34* (2006.01)
*C23C 24/04* (2006.01)

(52) U.S. Cl.
CPC ...... *H01J 37/3417* (2013.01); *C23C 14/3407* (2013.01); *C23C 14/3414* (2013.01);
(Continued)

(58) Field of Classification Search
CPC .................. H01J 37/3435; C23C 14/3414
See application file for complete search history.

(56) References Cited

U.S. PATENT DOCUMENTS 5,118,661 A * 6/1992 Maeda ................ C23C 14/3414
204/192.15
7,910,051 B2 3/2011 Zimmermann et al.
(Continued)

FOREIGN PATENT DOCUMENTS

EP 1666636 A1 6/2006
JP 2001295040 A 10/2001
(Continued)

OTHER PUBLICATIONS

Victor K. Champagne (Editor), "The cold spray material deposition process—Fundamentals and applications", Woodhead Publishing in Materials Feb. 16, 2009, Chapter 5.5—Comparison with other additive fabrication techniques.

*Primary Examiner* — Jason Berman
(74) *Attorney, Agent, or Firm* — Laurence A. Greenberg; Werner H. Stemer; Ralph E. Locher (57) ABSTRACT

A target includes a target plate and a stabilizing layer which is joined to the rear side of the target plate. The stabilizing layer was produced by high-kinetic-energy spraying of stabilizing material onto the target plate. A process for producing a target is also provided.

8 Claims, 3 Drawing Sheets

(52) U.S. Cl.
CPC .......... *C23C 14/3435* (2013.01); *C23C 24/04* (2013.01); *H01J 37/3426* (2013.01)

(56) References Cited

U.S. PATENT DOCUMENTS

| | | |
|---|---|---|
| 8,709,335 B1 | 4/2014 | Vlcek et al. |
| 2006/0121187 A1 | 6/2006 | Haynes et al. |
| 2008/0216602 A1* | 9/2008 | Zimmermann ............ B22F 7/08 75/245 |
| 2008/0271779 A1 | 11/2008 | Miller et al. |
| 2010/0015467 A1 | 1/2010 | Zimmermann et al. |
| 2011/0186421 A1 | 8/2011 | Friedli et al. |
| 2011/0303535 A1* | 12/2011 | Miller ....................... C23C 4/02 204/298.13 |
| 2012/0276682 A1 | 11/2012 | Lee et al. |
| 2013/0220805 A1 | 8/2013 | Tsukamoto et al. |
| 2013/0299347 A1 | 11/2013 | Rozak et al. |

FOREIGN PATENT DOCUMENTS

| | | |
|---|---|---|
| JP | 2002294440 A | 10/2002 |
| JP | 2008169482 A | 7/2008 |
| JP | 2008308728 A | 12/2008 |
| JP | 2013245375 A | 12/2013 |
| KR | 20130132325 A | 12/2013 |
| WO | 2006117145 A2 | 11/2006 |
| WO | 2008057710 A2 | 5/2008 |
| WO | 2008081585 A1 | 7/2008 |
| WO | 2011092027 A1 | 8/2011 |

\* cited by examiner

TARGET AND PROCESS FOR PRODUCING A TARGET

BACKGROUND OF THE INVENTION

Field of the Invention

The invention relates to a target and a process for the production thereof.

A target according to the invention is suitable for use in a PVD (physical vapor deposition) process for depositing layers on a substrate material provided for this purpose. For the purposes of the invention, a target is a sputtering target or an arc cathode.

One component of a target is the target material which in the course of the PVD process is ablated and deposited on the substrate to be coated. In most cases, this target material has been applied to one or more support plates or been joined thereto.

For example, WO 2011/092027 A1 discloses sputtering target for a magnetron sputtering unit, where the target has at least three target plates which are joined to a support plate. For example, the support plate can be fastened to the target plates by means of welding, soldering or casting-on.

It is also known that target material can be applied to appropriate support plates by spraying processes instead of conventional processes such as soldering. Thus, US 2008/0271779 A1 discloses that a pulverulent target material is applied directly to a support plate or a support tube so as to produce a target having a uniform particle size of less than 44 µm in one step.

A similar process for the spraying of target material is disclosed in WO 2008/81585 A1 in which, for example, pulverulent target material composed of aluminum or copper is sprayed onto support plates composed of copper or silicon.

WO 2006/117145 in turn discloses a method of reprocessing or producing sputtering targets or X-ray anodes by means of such a spraying process, especially for refractory metals. Here, powders composed of niobium, tantalum, tungsten, molybdenum, titanium, zirconium or mixtures or alloys thereof are used.

Spraying processes of this type in which a pulverulent metallic material is deposited on a substrate without the pulverulent metallic material being melted are also described, for example, in EP 1 666 636 A1. Such processes are also used much more widely for various components used in other fields of industry, for example for corrosion protection layers applied by cold gas spraying to components subjected to high corrosion stress. This is disclosed, for example, by WO 2008/57710 A2. The protective layers described have a preferred thickness of from 0.05 to 10 mm. It is particularly important here for the layers deposited to have a high purity and a low oxygen content and hydrogen content.

However, such spraying processes are not very suitable for brittle target materials; target plates composed of such material are usually produced by other methods such as by pressing of powders and sintering or conventional metallurgy. In the case of brittle target materials in particular it is often difficult to find suitable materials for support plates and also methods of joining target plates to support plates. The production of stable targets is thus made difficult and very often complicated and costly.

In the case of conventional target materials, too, which are likewise usually produced in a far greater quantity by other processes such as by pressing of powders and sintering or else conventional metallurgy, the provision of suitable support plates and joining these to the target plates often presents difficulties. Thus, for example, a solder connection is stable only up to use temperatures below the melting point of the soldering material, which in the worst case can lead to the target plate becoming detached during the PVD process. A difference in the coefficient of thermal expansion of target plates and support plates can also lead to considerable problems, for example as a result of stresses arising.

Since the joining of target plates to support plates usually also comprises a plurality of steps, the production of stable targets is also complicated and costly from a production engineering point of view.

SUMMARY OF THE INVENTION

It is therefore an object of the invention to provide a stable target which can be produced simply and a process for simple production of a stable target.

This object is achieved by the features of the independent claims recited below.

Advantageous embodiments are subject matter of the dependent claims.

According to the invention, a target which has a target plate composed of target material and a stabilizing layer, where the stabilizing layer is joined to the rear side of the target plate, i.e. the target plate and the stabilizing layer form one unit or form the target, is provided. The target or the target plate can, depending on requirements or equipment, have any (planar) shape, for example be round or angular. The front side of the target plate or of the target is the side from which target material is ablated during use in a PVD process or the side which when used in an apparatus faces a substrate to be coated. The rear side of the target plate is the side facing away from a substrate to be coated when the target is being used. The stabilizing layer has been applied to the target plate or produced thereon by means of high-kinetic-energy spraying of stabilizing material. That is to say, a stabilizing layer is gradually built up on the target plate by such a spraying operation, so that the entire/complete stabilizing layer has been produced by this spraying operation. Such a stabilizing layer can be applied either only to the rear side of the target plate or else at least partly on the side or circumferential faces.

High-kinetic-energy spraying processes are processes in which a coating material in powder form is applied at very high velocity to a substrate. For this purpose, a process gas (for example nitrogen, air, noble gases, steam) is accelerated to very high velocity by expansion in a nozzle (usually in a convergent/divergent nozzle such as a Laval nozzle) and the powder particles are subsequently injected into the gas jet. As an alternative, the powder particles are accelerated together with the process gas. The particles are accelerated to a velocity which is so high that on impingement of the substrate they form a dense and firmly adhering layer. High-kinetic-energy spraying processes suitable for the present invention are, for example, cold gas spraying or steam application processes.

A stabilizing layer applied by means of a high-kinetic-energy spraying process has a microstructure which results directly from the process used. Thus, the powder particles are cold-deformed on impingement on the substrate and the resulting dense and firmly adhering layer thus displays a deformed microstructure in which the former powder particles are elongated. Stabilizing layers applied by high-kinetic-energy spraying processes typically have an average aspect ratio of greater than 2 and usually in the range from 2 to 10. Both the particle size in the stabilizing layer (former powder particles) and the aspect ratio can be determined simply by means of a line section method on a metallographic polished cross section. Here, the relatively long axis employed for determination of the aspect ratio is parallel to the surface of the sprayed layer while the shorter axis is perpendicular thereto.

Depending on the duration of the spraying operation, a stable layer having a thickness of up to a number of millimetres or centimetres can be built up on the target plate. In particular, the spraying operation takes place at low temperatures which are below the melting point of the target material or stabilizing material, i.e. the target plate does not deform or deforms only insignificantly during spraying-on of the stabilizing layer. However, stresses can be introduced into the target plate by the spraying process or can remain in the stabilizing layer after the spraying operation.

The stabilizing layer acts as functional rear plate or stiffening element and serves to increase the stiffness (modulus of elasticity) or reinforce the target plate, i.e. the strength and stiffness of the target plate or the target are increased by application of the stabilizing layer, so that the target does not deform or deforms only insignificantly when used in a PVD apparatus. In such PVD apparatuses, the targets used are usually cooled by means of flexible (deformable) cooling plates arranged on the rear side of the targets. These cooling plates exert a pressure on the targets, which can in turn lead to deformation of the target, or if the target has a strength that is too low, to fracture. This effect is additionally reinforced by the thickness of the target being reduced by ablation during the coating process. As a result, deformation and/or fracture of the target is even more probable. Such cases of failure are largely avoided by the application of a stabilizing layer having an increased strength or stiffness.

When such targets are used in a PVD apparatus, high temperatures and/or high temperature gradients caused by introduction of high power densities of >10 W/cm$^2$ frequently occur. Temperatures or temperature gradients produced in this way have to be conducted away from the target (or targets) to the cooling plate and exert a high thermal cyclic loading on the latter. In embodiments of the invention, the stabilizing layer acts as heat sink, i.e. heat arising in the PVD process on the side of the target facing the substrate (front side) can be removed more readily via the target as a result of the spraying-on of stabilizing material having an increased thermal conductivity compared to the target plate.

A stabilizing layer applied by means of a high-kinetic-energy spraying process thus has a positive effect on the life and the function of a target according to the invention via at least one of the following effects:
 an increase in the strength
 an increase in the stiffness
 an increase in the thermal conductivity.

Furthermore, application of a stabilizing layer can aid the mechanical working of the rear side of the target for the purpose of meeting the requirements for fastening the target in the coating apparatus in the case of target material which is difficult to machine by cutting methods.

The spraying operation firstly produces an extremely stable bond between target plate and stabilizing layer and secondly enables an extremely dense stabilizing layer to be produced. Stabilizing layers having relative densities of >98% can be produced by a process according to the invention. The relative density of the stabilizing layer applied can be determined in a simple way by carrying out a density measurement by the buoyancy method.

The spraying operation does not increase or change, or does not significantly increase or change, the content of the elements H, N, O in the stabilizing layer (compared to the contents in the starting powder). The content of these elements can be determined by means of chemical analysis.

A process according to the invention is particularly advantageous when the target plate used can be joined only with difficulty to the material used for the stabilizing layer because of the technologically determined production route or the technological boundary conditions. This applies particularly in the case of large differences between the melting points or the deformability of the materials of which firstly the target plate and secondly the stabilizing layer consist.

A process according to the invention is particularly suitable for target plates composed of aluminum-based materials, chromium-based materials, titanium-based materials or ceramics.

For the present purposes, aluminum-based materials are both aluminum alloys and aluminum composites containing at least 50 at % of aluminum, for example having the compositions (in at %) AlTi 75/25, AlTi 67/33, AlTi 50/50 or AlCr 70/30.

For the present purposes, chromium-based materials are pure chromium, chromium alloys and also chromium composites containing at least 50 at % of chromium, for example having the compositions (in at %) CrB 90/10, CrSi 90/10, CrV 80/20, CrTi 80/20 or CrW 95/5.

For the present purposes, titanium-based materials are pure titanium, titanium alloys and also titanium composites containing at least 50 at % of titanium, for example having the compositions (in at %) TiB 90/10, TiSi 80/20, TiNb 70/30, TiMo 50/50 or TiW 50/50.

For the present purposes, composites are materials which are made up of a plurality of components or elements which are not dissolved, or only partly dissolved, in one another. Thus, for example, a densified mixture of aluminum particles having embedded chromium particles is referred to as an aluminum-chromium composite.

Ceramics to be used for target plates in targets according to the invention are borides, carbides, nitrides, silicides and oxides, for example TiB2, WC, SiC, TiN, CrSi2, MoO3.

Suitable materials for use as stabilizing layer in a target according to the invention are, for example, copper, copper alloys, including brass and bronzes, aluminum, aluminum alloys, titanium, titanium alloys and steel.

Preference is given to a combination of an aluminum composite as target plate and copper or a copper alloy as stabilizing layer. In addition to stabilizing (reducing elastic and/or plastic deformation) of the target plate, a stabilizing layer composed of copper has a high thermal conductivity which, for example, makes effective cooling by means of water cooling on the rear side of the target possible. The thermal conductivity of sprayed copper layers is comparable with that of bulk copper.

An alternative preferred embodiment has a stabilizing layer composed of steel on a target plate composed of a chromium composite. Apart from the increased stiffness due to the higher modulus of elasticity, a stabilizing layer composed of steel has a higher ductility which counters failure of the target by brittle fracture.

In addition, in further embodiments of the invention, an above-described stabilizing layer can be coated with one or more further layers composed of materials having a different stiffness, yield point or thermal conductivity compared to the first layer. It is particularly advantageous for the one layer or plurality of further layers to be likewise applied by means of a high-kinetic-energy spraying process, i.e. the total multilayer stabilizing layer in such an embodiment is sprayed by means of such a process onto the target plate.

Thus, for example, a first layer of copper or a copper alloy can be supplemented, in one embodiment, by a further layer comprised of steel. The two materials (copper and steel) have two different effects: copper offers excellent thermal conduction properties so that heat is quickly removed and the target material is thus not thermally overstressed, while steel has a somewhat higher yield point than copper and ensures, also as a result of the higher modulus of elasticity, that the target material will withstand the pressures in the apparatus and thus additionally protects the target against elastic or plastic deformation. For example, the target is clamped by the water pressure of the cooling water in some apparatuses; here, the pressure of the cooling water is applied to the rear side of the target via a flexible membrane which separates the water circuit from the vacuum chamber. The material is thus simultaneously clamped and cooled, i.e. mechanically and thermally stressed.

In a further preferred embodiment, the composition of the stabilizing layer changes perpendicularly with increasing distance from the target plate. In a further preferred embodiment, the composition of the stabilizing layer changes parallel to the target plate, i.e., for example, in the radial direction in the case of a disc-shaped target.

For example, the composition of the stabilizing material is altered during spraying onto the target plate so as to give a gradient in respect of the composition of the stabilizing layer. Here, it is possible for a change of the stabilizing material to be made or for a stabilizing material to be altered gradually, e.g. by alloying. A gradient which has been established in this way can be associated with a gradient in respect of the stiffness, the strength or the thermal conductivity. The gradient can be discontinuous/stepwise or continuous, and it is also possible for only part of the stabilizing layer or, in the case of multilayer stabilizing layers, individual sublayers to be gradated.

Thus, for example, it is possible, in one embodiment, for pure copper to be firstly sprayed on as stabilizing material and one or more additional components to be gradually added to this copper in order to increase the stiffness and strength of the stabilizing layer. Examples are copper alloys having alloying elements such as Al, Ni, Fe, Mn, Zn, Sn, Cr, Si, Zr, for example CuAl or CuCrZr.

In the same way, titanium and titanium alloys, for example titanium with vanadium, can naturally be used for embodiments of the invention.

In the same way, aluminum and aluminum alloys, for example aluminum with silicon, can naturally be used for embodiments of the invention.

In the same way, steels having a gradually changing composition can naturally be used for embodiments of the invention.

A target according to the invention can, for example, have a round shape and have, for example, a diameter in the range from 50 mm to 400 mm and a thickness in the range from 5 mm to 40 mm. As an alternative, a target of the invention can have a rectangular shape, with the width of the target preferably being in the range from 50 mm to 250 mm and the length of the target preferably being in the range from 200 mm to 2000 mm.

The size ratio perpendicular to the target surface or the ratio of the thickness of the stabilizing layer to the thickness of the target plate is preferably in the range from 1/1 to 1/5, with the ratio particularly preferably being from 1/2 to 1/4. For example, the stabilizing layer has a thickness in the range from 1 mm to 10 mm, preferably from 2 mm to 5 mm, e.g. the target plate has a thickness of 8 mm and the stabilizing layer has a thickness of 4 mm.

At least part of the stabilizing layer preferably projects sideways beyond an edge of the target plate. The stabilizing layer particularly preferably forms a circumferential flange, i.e. the target can be clamped in a simple manner into a PVD apparatus by means of the sprayed stabilizing layer without the target material being covered, e.g. by a clamping device. As an alternative, the stabilizing layer and the target plate can be flush at the sides.

The rear side of the target plate preferably has at least one depression, for example one (or more) for example spiral channel(s), groove(s) and/or notch(es), so that a profiled surface having a plurality of depressions or raised regions is provided before application of the stabilizing layer. Since the target plate gains a larger surface area as a result of the depressions (raised regions), the join between target plate and stabilizing layer is stronger and the stiffness of the target is increased. Such an embodiment is particularly advantageous when the stabilizing material has a coefficient of thermal expansion which is different from that of the target material. In addition, the greater surface area of the rear side of the target plate provided by the depressions or raised regions ensures improved heat removal.

In a preferred embodiment, the target has a diffusion-promoting layer to aid bonding arranged between the target plate and stabilizing layer. An example of such a bonding layer is electrochemically applied nickel.

The rear side of a target according to the invention can, in embodiments, have a thread or cut-outs, for example for accommodating magnets.

A process according to the invention according to claim 7 for producing a target, in particular a target as described above, firstly provides a target plate. Stabilizing material is subsequently sprayed onto the rear side thereof by means of a high-kinetic-energy spraying process, so that a stabilizing layer is produced or built up on the rear side of the target plate. The parameters to be set for a process according to the invention, for example selection of the process gas, process gas pressure, process temperature, distance from the target plate, spray angle, can be determined in a simple way in the course of an optimization procedure. Likewise, powders or powder mixtures which can be used for a process according to the invention can be determined in the course of an optimization procedure in respect of composition, particle size, particle shape and particle size distribution. The determination of the particle size and particle size distribution is carried out in a simple way by means of a dry measurement using a Malvern Mastersizer 2000.

Particular preference is given to at least one depression being generated or produced on the rear side of the target plate before spraying of the stabilizing material onto the target plate, i.e. the rear side of the target plate is profiled, e.g. by means of a plurality of depressions located next to one another, e.g. round or angular holes or channels.

Before application of the stabilizing layer, a diffusion-promoting layer to aid bonding can be applied to the target plate in order to improve bonding between target plate and stabilizing layer further. Such a layer can, for example, be applied electrochemically, but other deposition methods, for example PVD or suspension coating, are also possible.

The spraying-on of the stabilizing material can optionally be followed by a heat treatment by means of which any residual stresses generated and remaining in the target plate and stabilizing layer can be dissipated. Diffusion processes at the interface between target plate and stabilizing layer or, in the case of multilayer stabilizing layers, between the sublayers, can be induced by such an optional heat treatment and the adhesion can thus be improved further.

After application of the stabilizing layer, a final machining of the joined target plate and stabilizing layer preferably takes place. The target is machined, for example by means of turning, milling and/or grinding, until it has the desired final dimensions. A thread, for example, can also be cut into the rear side of the target according to the invention, and recesses, for example for accommodating magnets, can be provided, by means of such machining.

Individual features of the embodiments of the target and of the process for producing a target which are described above and below can be combined with one another in any way.

TABLE 1

Examples of dimensions of targets according to the invention

| Diameter and thickness of disc-shaped targets | Width, length and thickness of rectangular targets |
|---|---|
| Ø 63 mm × 32 mm | 400 mm × 88 mm × 10 mm |
| Ø 105 mm × 16 mm | 500 mm × 88 mm × 10 mm |
| Ø 105 mm × 15 mm | 200 mm × 88 mm × 10 mm |
| Ø 160 mm × 12 mm | 14 mm × 176 mm × 911 mm |
| Ø 150 mm × 6 mm | 14 mm × 132 mm × 609 mm |
| Ø 148 mm × 12 mm | 12 mm × 170 mm × 1000 mm |
| | 12 mm × 170 mm × 830 mm |
| | 12 mm × 125 mm × 150 mm |
| | 12 mm × 125 mm × 600 mm |

TABLE 2

Materials data for materials which can be used in a target according to the invention

| Material | Modulus of elasticity [GPa] | Yield point at room temperature [MPa] | Thermal conductivity [W/(m * K)] |
|---|---|---|---|
| Aluminum | 70 | 40 | 220 |
| Chromium | 190 | No figures because of brittleness | 70 |
| Titanium | 105 | 220 | 20 |
| WC | 710 | No figures because of brittleness | 120 |
| $TiB_2$ | 365 | No figures because of brittleness | 100 |
| Copper | 125 | 160 | 390 |
| Steel 1.4404 | 195 | 350 | 20 |

Both the dimensions given in Table 1 and the values given in Table 2 should be taken to be guideline values. It is naturally also possible to produce or use other dimensions and other materials.

The materials data in Table 2 are guideline values because the yield point in particular is influenced greatly by the microstructure, the content of alloy elements or impurities and also the heat treatment state.

BRIEF DESCRIPTION OF THE SEVERAL VIEWS OF THE DRAWING

Embodiments of the invention will be illustrated with the aid of the figures. The figures show:

FIG. 1 a schematic depiction of part of a spraying apparatus for a high-kinetic-energy spraying process, FIG. 2*a-b* two sectional schematic side views of two embodiments of a target, FIG. 3 an etched polished cross section of a copper bulk material, FIG. 4 an etched polished cross section of a copper layer which has been applied by means of a high-kinetic-energy spraying process (cold gas spraying), FIG. 5 an etched polished cross section of the boundary region between a target plate composed of AlCr 70/30 at % and a sprayed stabilizing layer composed of Cu, and FIG. 6 an etched polished cross section of the boundary region between a target plate composed of Cr and a sprayed stabilizing layer composed of steel.

DESCRIPTION OF THE INVENTION

Figure 1:
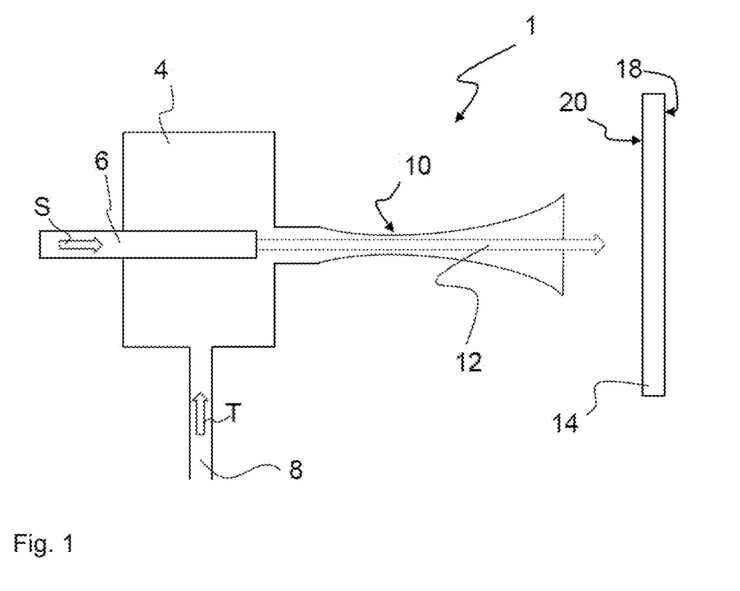

FIG. 1 shows a schematic depiction of part of a spraying apparatus 1 for a high-kinetic-energy spraying process to illustrate the principle. A spray gun housing 4 has a convergent/divergent nozzle 10 in order to accelerate process gas T supplied through a process gas line 8 to supersonic velocity. A spray material S, i.e. a plurality of particles, is introduced into the accelerated process gas stream T via a spray material line 6 and this is accelerated by the process gas stream T in the direction of the rear side 20 of the target plate 14. There, the spray material impinges and remains adhering to the rear side of the target plate 14. The front side 18 of the target plate 14 corresponds to the side facing a substrate to be coated in a PVD process.

Figure 2:
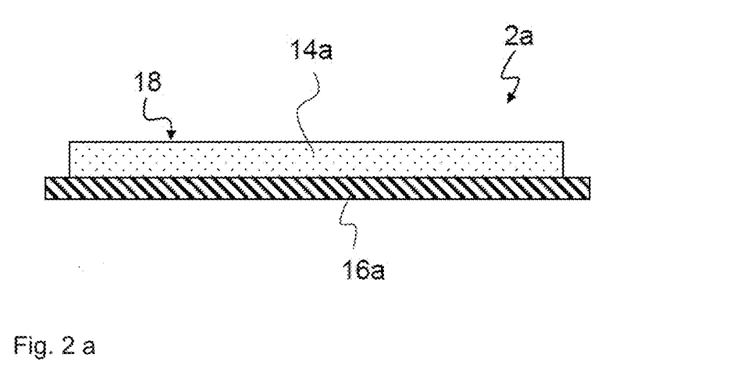

As a result of the spraying, a layer of the spraying material S is built up on the rear side 20 of the target plate 14. As shown in FIG. 2*a-b*, the spraying operation is carried out until a stabilizing layer 16*a-b* has been formed. The spraying material S adheres extremely strongly to the target plate 14*a-b* or to the target material as a result of the spraying. This is particularly advantageous when the target plate used is difficult to join to the material used for the stabilizing layer because of the technologically determined production route or the technological boundary conditions.

In one embodiment, the composition of the stabilizing material is changed during spraying, so that a gradient is obtained in the stabilizing layer 16*a-b*. Here, the composition is changed in such a way that the strength and stiffness of the stabilizing layer 16*a-b* produced is increased. For example, pure copper is used at the beginning of spraying and one or more elements are gradually added to the copper so that a stabilizing layer having increased strength and stiffness is obtained. As an alternative, the entire stabilizing layer can be made homogeneously of one copper alloy or one copper composite.

As can be seen in FIG. 2*a*, the stabilizing layer 16*a* projects at the side beyond the target plate 14*a* and forms a (continuous or interrupted) flange by means of which the target 2*a* can be fastened in a PVD apparatus.

As can be seen in FIG. 2*b*, the target plate 14*b* and the stabilizing layer 16*b* can, as an alternative, be flush at the side, depending on the type of fastening device present in the PVD apparatus.

FIG. 2*b* shows a further embodiment of a target 2*b* in which the rear side of a target plate 14*b* has a plurality of depressions or raised regions into which the stabilizing material is sprayed during production by means of a high-kinetic-energy spraying process, i.e. the surface area of the target plate 14*b* is increased by the profiling, as a result of which the stability of the bond between target plate 14*b* and stabilizing layer 16*b* is increased and, in addition, the stiffness of the target 2*b* is increased by the geometric profiling. The heat removal is also improved by the increased surface area.

Figure 3:
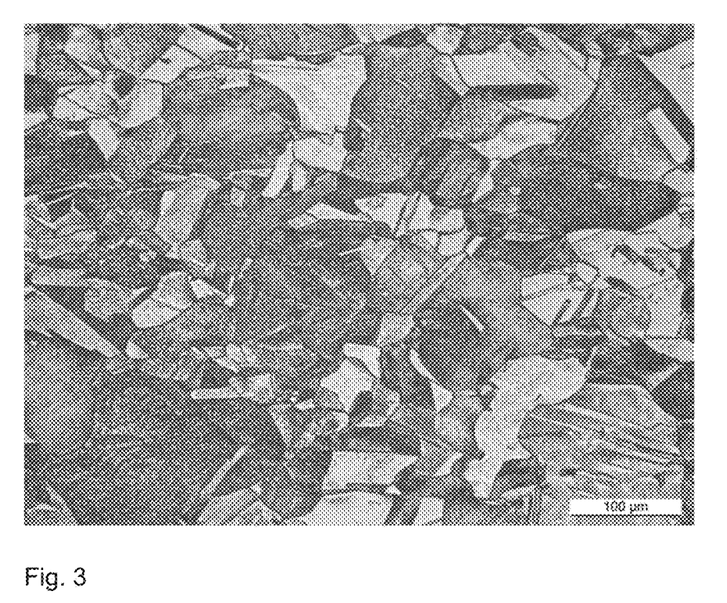
Figure 4:
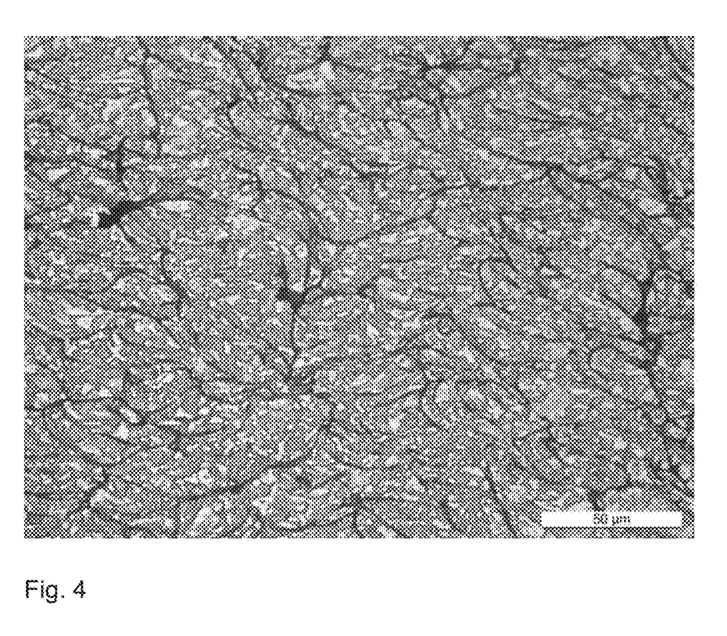

FIG. 3 shows an etched polished cross section of a copper bulk material. For comparison, FIG. 4 shows an etched polished cross section of a copper layer which has been applied by means of cold gas spraying, with the particle boundaries having been etched in order to make the microstructure more clearly visible. The copper powder used has an average particle size of less than 45 µm, but it is also possible to use copper powders having other particle sizes, for example particle sizes in the 100 µm range (from a few tens of µm to about 150 µm particle size). Specifically, a powder having an average particle size of 31.0 µm, a D10 of 11.2 µm, a D50 of 28.9 µm and a D90 of 53.8 µm was used for the copper layer depicted in FIG. 4.

Comparing FIG. 3 and FIG. 4, it can clearly be seen that a deformed microstructure is formed by the spray operation. In this example, there is therefore an elongation of the Cu particles with an average aspect ratio of greater than 2.

Example 1

Figure 5:
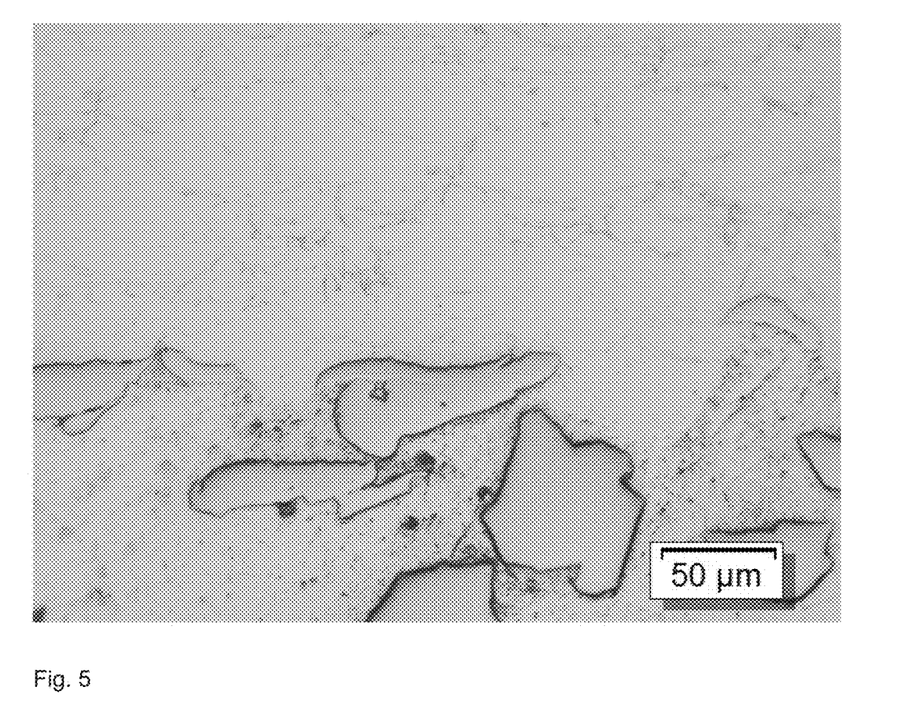

FIG. 5 shows an etched polished cross section of the boundary region between a target plate and a cold-gas-sprayed stabilizing layer composed of pure copper. The microstructure of the target plate composed of AlCr 70/30 at % consists of a densified mixture of aluminum particles with embedded chromium particles, i.e. an aluminum-chromium composite. A stabilizing layer of copper was applied thereto by means of cold gas spraying. The cold gas spraying produces an extremely strong bond between the two materials copper and the aluminum-chromium composite. In particular, the copper is "shot" into the target plate by the high acceleration in cold gas spraying, so that the two materials are intermeshed in the boundary region. The achieved relative density of the cold-gas-sprayed copper as stabilizing material is in the case depicted 99.3%; no additional gas uptake into the layer caused by the spraying operation could be observed. The average particle size of the stabilizing layer composed of copper is, in this example, <45 µm in the direction of the thickness of the target. The stabilizing layer was sprayed in lines at a pressure of 32 bar and a temperature of 500° C. using nitrogen, the spray angle was 90° and the distance from the target plate was 30 mm.

Example 2

Figure 6:
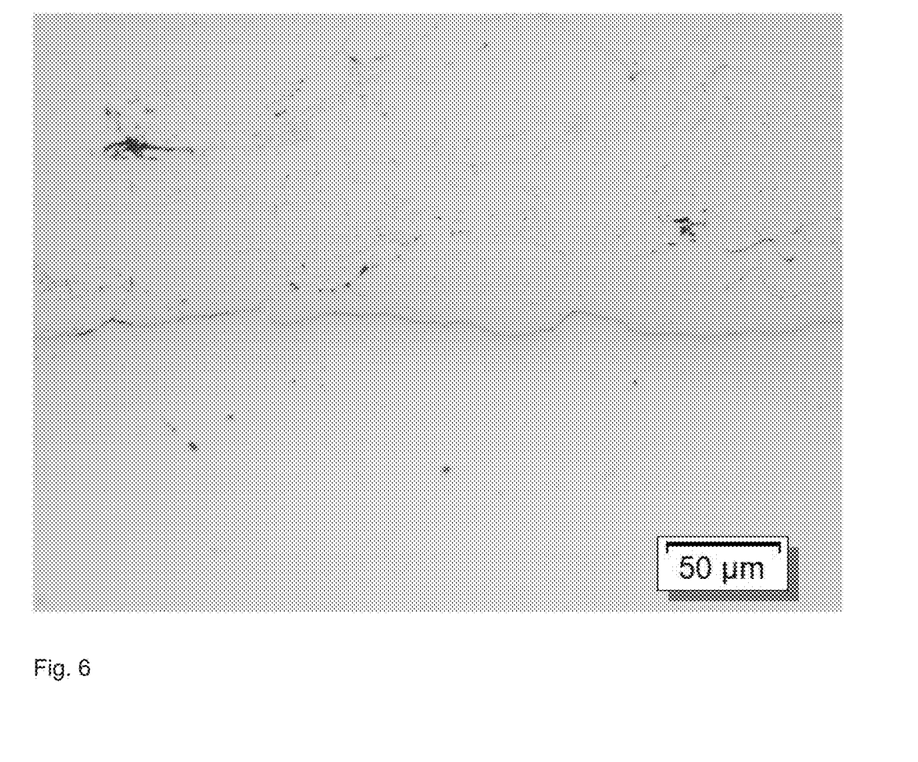

FIG. 6 shows an etched polished cross section of the boundary region between a target plate composed of chromium and a stabilizing layer composed of steel produced by means of a steam application process. A layer of steel can be used both as single stabilizing layer and additionally as a supplement to a layer composed of a copper alloy or copper, particularly when a rear plate having a further increased yield point or stiffness is to be produced. The two materials (copper and steel) have two different functions in this case: copper ensures that the heat is efficiently conducted away from the target plate and the target material is therefore not thermally overloaded, while steel ensures, by means of the higher yield point and higher stiffness, that the target material withstands the pressures determined by the apparatus and thus protects the material against deformation or fracture.

The stabilizing layer composed of steel depicted in FIG. 6 was applied directly to a target plate composed of chromium. A 1.4404 steel powder having an average powder particle size of <63 µm was employed here. Specifically, a powder having an average particle size of 55.9 µm, a D10 of 26.9 µm, a D50 of 53.8 µm and a D90 of 88.1 µm was used for the steel layer depicted in FIG. 6. The achieved relative density of the steam-applied steel as stabilizing material is in the case depicted 98%; no additional gas uptake in the layer caused by the spraying operation could be found. The stabilizing layer composed of steel was sprayed in a plurality of lines and a plurality of successive layers onto the substrate at a temperature of 400° C. using steam, the spraying angle was 90° and the distance from the target plate was 65 mm.

LIST OF REFERENCE SYMBOLS

1 Spraying apparatus for a high-kinetic-energy spraying process
2a-b Target
4 Spray gun housing
6 Spray material line
8 Process gas line
10 Convergent/divergent nozzle
12 Spray material supply+carrier gas supply
14, 14a-b Target plate
16a-b Rear plate/stabilizing layer
18 Target plate front side
20 Target plate rear side
S Spray material stream+carrier gas stream
T Process gas stream

The invention claimed is:

1. A target, comprising:
    a target plate made of a target material configured for physical vapor deposition, said target plate having a rear side;
    a stabilizing layer joined to said rear side of said target plate, said stabilizing layer being formed of a material different from said target material, said stabilizing layer being formed to support said target material on said rear side of said target plate and said stabilizing layer having characteristics of having been applied to said target plate by high-kinetic-energy spraying of stabilizing material; and
    a composition of said stabilizing material being configured to change during the spraying so that a continuous material gradient is obtained in said stabilizing layer and said composition being configured to increase a strength and a stiffness of said stabilizing layer.

2. The target according to claim 1, wherein said target plate is made of a material selected from the group consisting of aluminum-based materials, chromium-based materials, titanium-based materials and ceramics.

3. The target according to claim 1, wherein said stabilizing layer is made of one or more materials selected from the group consisting of copper, copper alloys including brass and bronzes, aluminum, aluminum alloys, titanium, titanium alloys and steel.

4. The target according to claim 1, wherein a ratio of a thickness of said stabilizing layer to a thickness of said target plate is in a range of from 1/1 to 1/5.

5. The target according to claim 1, wherein a ratio of a thickness of said stabilizing layer to a thickness of said target plate is in a range of from 1/2 to 1/4.

6. The target according to claim 1, wherein said rear side of said target plate has at least one depression formed therein.

7. A process for producing a target, the process comprising the following steps:
    providing a target plate made of a target material configured for physical vapor deposition, said target plate having a rear side;
    providing a stabilizing material that is different from the target material and spraying the stabilizing material onto the target plate by using a high-kinetic-energy spraying process producing a stabilizing layer on the rear side of the target plate, said stabilizing layer being formed to support said target material on said rear side of said target plate; and altering the composition of the stabilizing material during spraying onto the target plate so as to give a continuous material gradient in respect of the composition of the stabilizing layer, and altering the composition in such a way that a strength and a stiffness of said stabilizing layer thus produced is increased.

8. The process according to claim 7, which further comprises applying a diffusion-promoting layer to aid bonding.

* * * * *